United States Patent [19]

Okada et al.

[11] Patent Number: 4,518,993
[45] Date of Patent: May 21, 1985

[54] TELEVISION SIGNAL RECEIVING SYSTEM

[75] Inventors: Hisao Okada, Yokohama; Seiichiro Tanaka, Tokyo; Seiji Kawaberi, Yokohama, all of Japan

[73] Assignee: Sony Corporation, Tokyo, Japan

[21] Appl. No.: 324,137

[22] Filed: Nov. 23, 1981

[30] Foreign Application Priority Data

Nov. 27, 1980 [JP] Japan ............... 55-167110

[51] Int. Cl.³ .................. H04N 7/16; H04B 1/26
[52] U.S. Cl. ..................... 358/114; 358/86; 455/176; 455/180; 455/190
[58] Field of Search .......... 358/114, 86; 455/176, 455/180, 190

[56] References Cited

U.S. PATENT DOCUMENTS

| 3,333,198 | 7/1967 | Mandell et al. | 358/86 |
| 3,886,302 | 5/1975 | Kosco | 358/114 |
| 4,081,831 | 3/1978 | Tang et al. | 358/114 |
| 4,109,281 | 8/1978 | Kanazashi et al. | 358/114 |
| 4,191,966 | 3/1980 | Ounick | 358/86 |
| 4,216,500 | 8/1980 | St. Louis | 358/118 |
| 4,245,245 | 1/1981 | Matsumoto et al. | 358/122 |
| 4,316,217 | 2/1982 | Rifken | 358/86 |
| 4,330,794 | 5/1982 | Sherwood | 358/114 |
| 4,355,415 | 10/1982 | George et al. | 358/114 |
| 4,379,271 | 4/1983 | Lehmann | 455/180 |

Primary Examiner—S. C. Buczinski
Attorney, Agent, or Firm—Lewis H. Eslinger; Alvin Sinderbrand

[57] ABSTRACT

A television receiver for receiving standard television channel signals and a scrambled television channel signal includes a channel selector which selects one of the television channel signals, a tuner which tunes the selected television channel signal, and a converting circuit which converts the scrambled television channel signal to a vacant standard television channel signal for tuning by the tuner.

20 Claims, 7 Drawing Figures

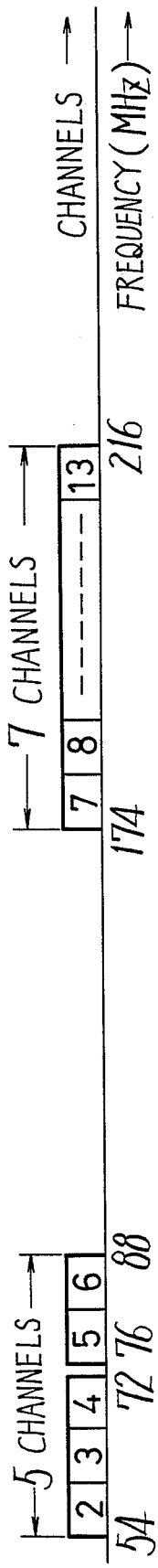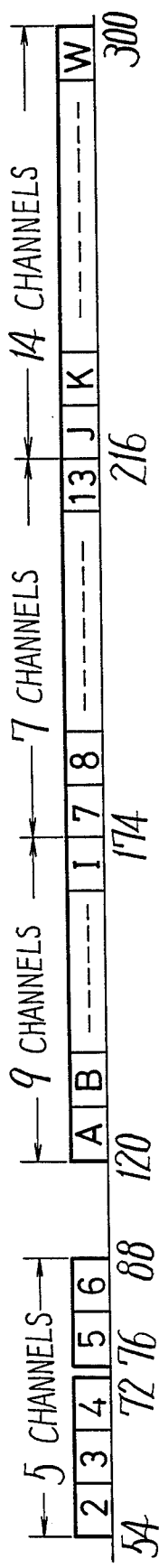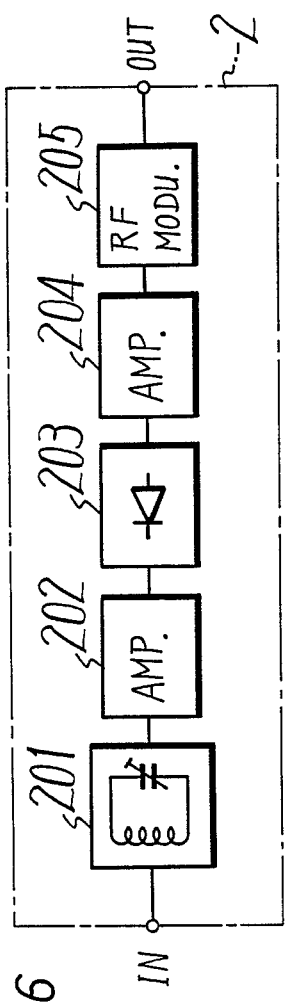

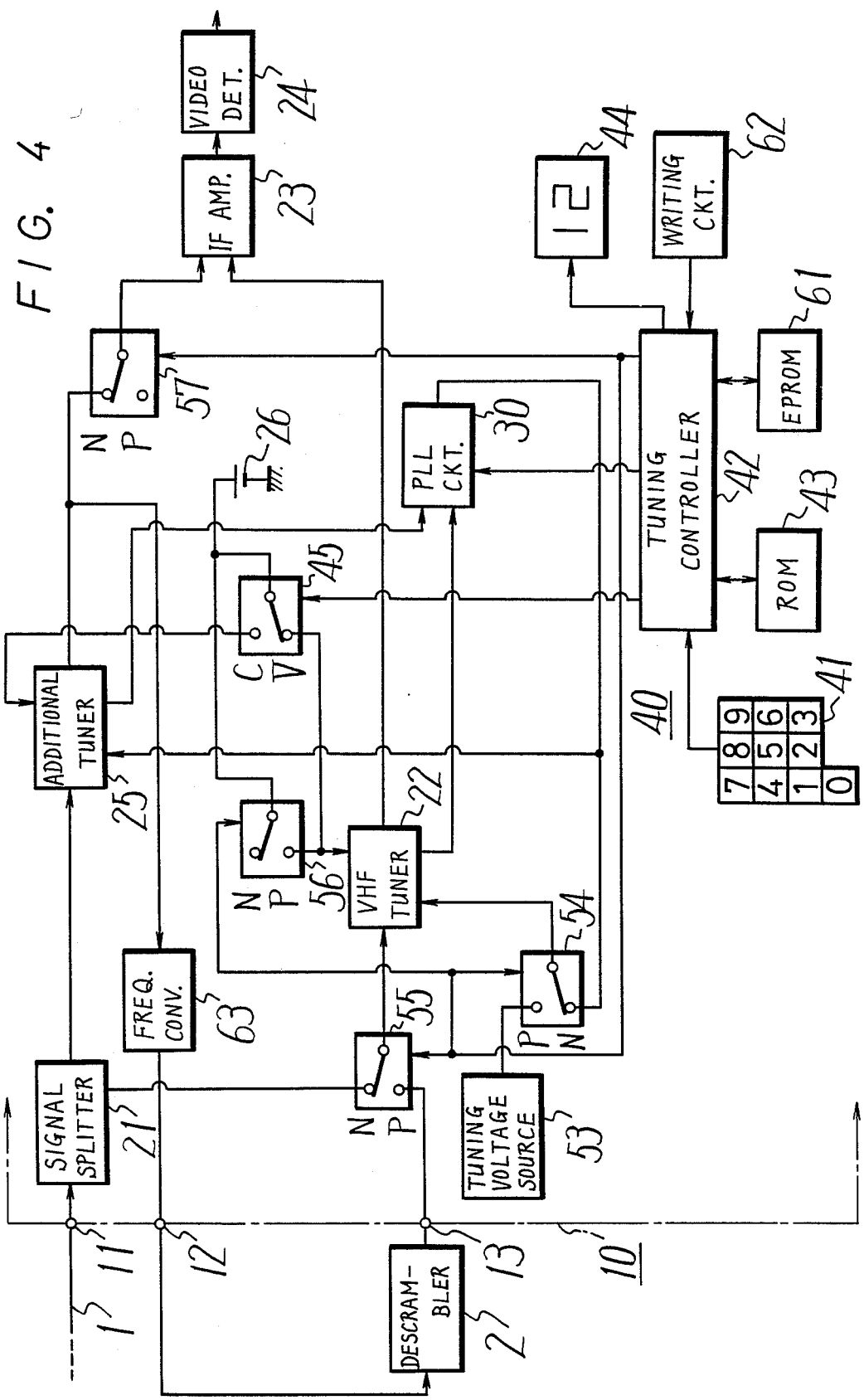

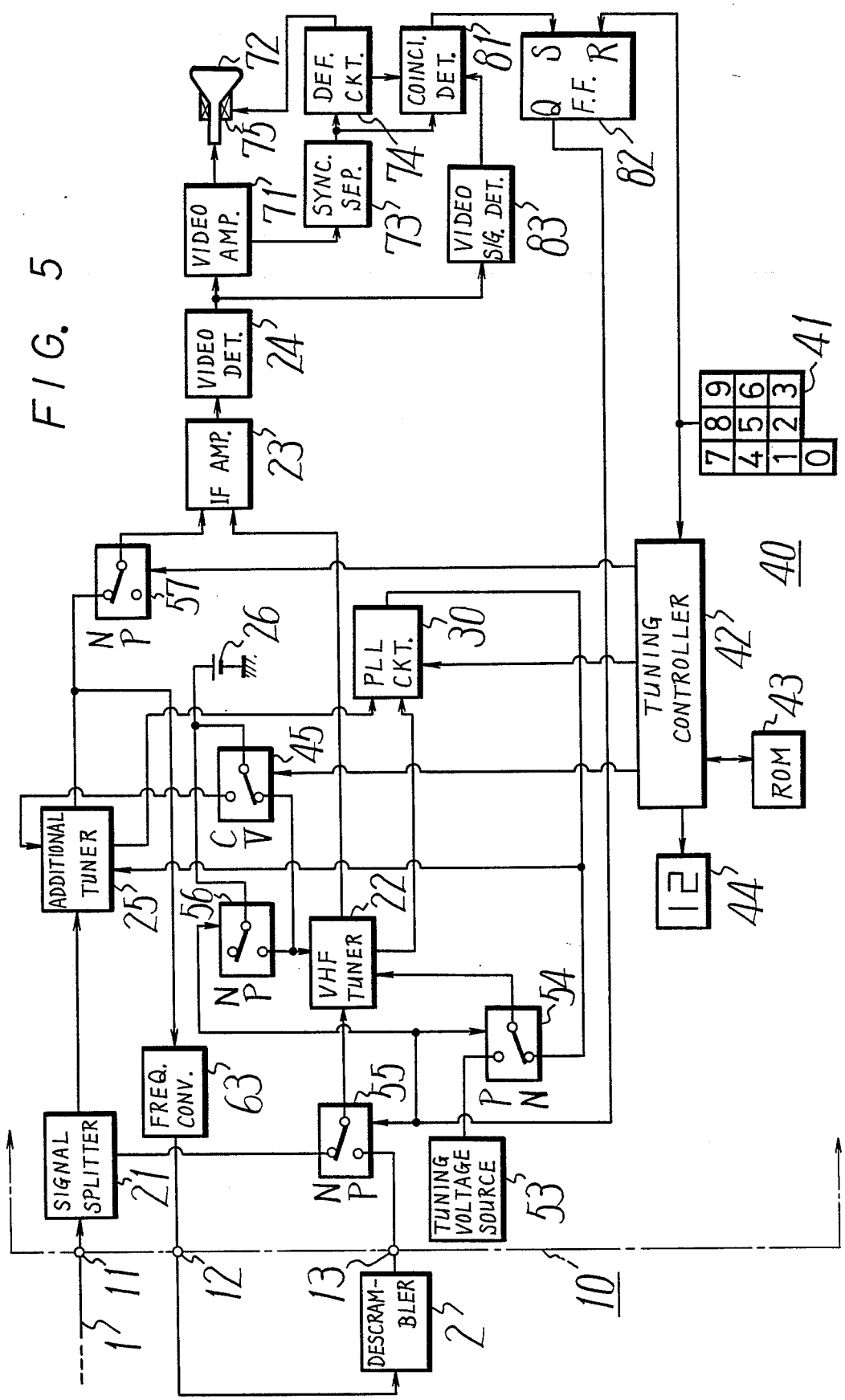

TELEVISION SIGNAL RECEIVING SYSTEM

BACKGROUND OF THE INVENTION

1. Field of the Invention

The present invention relates to a television signal receiving system, and more particularly, to a television signal receiving system for use with a cable television broadcast otherwise known as a CATV broacast.

2. Description of the Prior Art

In the U.S.A., for example, conventional VHF television broadcasts are carried out by assigning channels 2 to 13 with the available frequency band, as shown in FIG. 1A. In case of the CATV broadcast, however, as shown in FIG. 1B, channels A to W (A to I and J to W) in the vacant frequency band portion of the conventional VHF television broadcast frequency band are also used. In the case of a CATV broadcast, the signals of the additional CATV channels (channels A to W) and the signals of the conventional VHF channels 2 to 13 are transmitted together along a coaxial cable.

There is a system in which special broadcasts are transmitted along certain channels among the additional CATV channels. An ordinary viewer can not receive the special broadcasts without paying a fee. The special channel is called a pay-channel, and a viewer rents a receiving adaptor in order to receive the special broadcasts on the pay-channels. The receiving adaptor is called a descrambler.

The additional CATV channels are usually divided into free CATV channels and pay-channels. In order to receive the conventional VHF channels, the free CATV channels the pay-channels with a prior art descrambler, it is necessary for a viewer not only to switch the channel of a television receiver but also to switch the channel of the descrambler. This is rather complicated just for watching television.

Further, even though prior art television receivers have remote control operation for changing channels, the descrambler (generally provided separately) can not be controlled by such a remote control. Thus, channel changing can not be performed by the remote control. Even if it is possible, a special remote control system must be employed. In other words, the prior art remote control system can not be used as it is, and is incomplete.

OBJECTS AND SUMMARY OF THE INVENTION

Accordingly, it is an object of the present invention to provide an improved television signal receiving system which can receive both a standard television signal and a non-standard television signal or scrambled television signal.

it is another object of the present invention to provide a television signal receiving system which includes an improved descrambler for reproducing a video signal from a scrambled television signal.

It is still a further object of the present invention to provide a television signal receiving system which includes a descrambler in which no channel selection operation is necessary.

It is still a further object of the present invention to provide a television signal receiving system which includes the combination of a descrambler and a television receiver and the channel selection operation which can be performed by an apparatus connected to the television receiver.

According to an aspect of the present invention there is provided a television signal receiving system which comprises:

an input terminal for receiving television signals including standard television signals each transmitted through an allotted channel of television channels and a non-standard television signal transmitted through a predetermined channel of said television channels;

converting means connected to said input terminal for converting said non-standard television signal to said standard television signal occupying a vacant channel in said television channels; and signal output means connected to said input terminal and to said converting means for deriving compound television signals including said standard television signals and said converted standard signal.

the above, and other objects, features and advantages of the present invention will become apparent from the following detailed description of illustrative embodiments which is to be read in conjunction with the accompanying drawings.

BRIEF DESCRIPTION OF THE DRAWINGS

FIGS. 1A and 1B are frequency band diagrams used to illustrate the present invention;

FIGS. 2 to 5 are block diagrams illustrating alternate embodiments of television signal receiving system in accord with the present invention; and FIG. 6 is a block diagram showing an embodiment of a descrambler used in conjunction with the television signal receivng system of FIGS. 2 to 5.

DESCRIPTION OF THE PREFERRED EMBODIMENTS

A first embodiment of a television signal receiving system according to the present invention will now be explained with reference to FIG. 2. In the figure, a coaxial cable 1 carries a CATV signal to a descrambler 2. Since descrambler 2 has no direct relation to the subject matter of the present invention, it is not shown in detail in FIG. 2 for the sake of simplicity. Descrambler 2 is constructed so that it converts a scrambled television signal of a pay-channel to a standard television signal on an unused conventional VHF channel such as channel 3.

Figure 2:
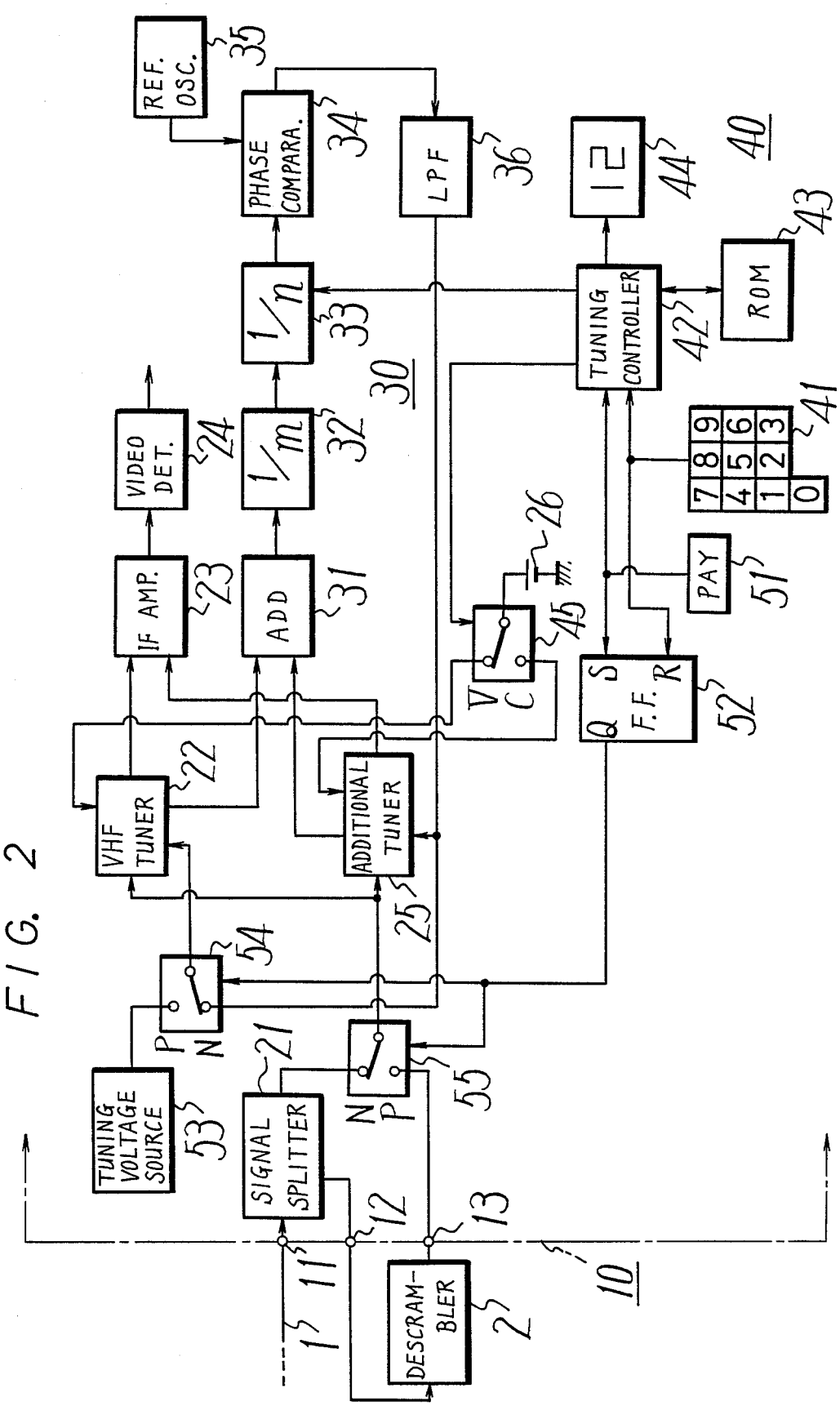

In FIG. 2, 10 the television signal receiving system includes a television receiver 10, a tuner 22 for conventional VHF channels, and an additional tuner 25 for tuning additional free CATV channels. Tuners 22 and 25 include respectively variable capacitance diodes as resonance elements and in a preferred embodiment tuners capable of selecting a desired channel in response to tuning voltages supplied thereto. The video intermediate frequency (VIF) signal from tuner 22 and 25 is supplied through a VIF amplifier 23 to a video detector 24.

In FIG. 2, a PLL (phase locked loop) circuit 30 is constructed as next described. The local oscillating signal from tuner 22 or 25 is fed through an adding circuit 31 to a divider circuit 32 in which the signal is frequency-divided by 1/m (m is a constant value). The frequency-divided signal therefrom is supplied to a programmable counter 33 to be frequency-divided by 1/n (n is a predetermined value). The frequency-divided signal therefrom is applied to a phase comparator circuit 34 which is also supplied with an oscillation signal of a reference frequency from a reference oscillator circuit 35. The compared output from phase oscillator circuit 34 is supplied to a low pass filter 36 from which a tuning voltage is derived.

Further, in FIG. 2, a tuning control circuit generally denoted by numeral 40 selects a channel in accordance with the operation by a viewer. Tuning control circuit 40 comprises a key-board 41 for inputting a selected channel, a tuning controller 42 for generating control signals, a read-only-memory (ROM) 43 on which frequency dividing ratio 1/n corresponding to the channel is written, and a channel display device 44. After a channel is selected, a key of key-board 41 corresponding to a desired channel number is operated. In the illustrated example, the A to W channels of the additional CATV channels correspond to 84 to channels 106. For example, when the A channel, is selected, the keys of "8" and "4" are sequentially operated (as is known channels 14 to 83 are UHF channels.)

A switch circuit 45 becomes one state upon receiving the conventional VHF channels and a pay-channel and another state upon receiving the additional free CATV channels. Switch circuits 54 and 55 each change to one state when receiving the conventional VHF channels and additional free CATV channels and become another state when receiving a pay-channel.

With the system of FIG. 2, when a conventional VHF channel, for example, channel 2 is received, the key "2" of key-board 41 is pushed. The output signal from key-board 41 is then supplied to controller 42 which discriminates channel 2 and accordingly supplies a control signal to a switch circuit 45 so that it is connected to contact V. Thus, the DC voltage from a power source 26 is supplied through switch circuit 45 to tuner 22 as the operating voltage.

Further, output signal from key-board 41 is supplied to an RS flip-flop circuit 52 to reset flip-flop circuit 52. Then, the Q-output of flip-flop circuit 52 is supplied to switch circuits 54 and 55 as a control signal to connect each to a contact N. Accordingly, the television signal through cable 1 is supplied to tuner 22 through an antenna terminal 11, a signal splitter 21 and switch circuit 55.

Further, the data for the frequency dividing ratio 1/n corresponding to channel 2 is read out from ROM 43 by controller 42 and then set in counter 33. Thus, the tuning voltage corresponding to channel 2 is derived from low pass filter 36 and supplied to tuner 22 through switch circuit 54. Accordingly, the VHF television broadcast signal for channel 2 is selected by tuner 22 and the corresponding video signal can be derived from the video detector 24.

When an additional free CATV channel, for example, channel A is received, this channel corresponds to channel 84, so that keys "8" and "4" of key-board 41 are sequentially pushed. The output signal from key-board 41 is then supplied to controller 42 which then discriminates channel A. Thus, switch circuit 45 is connected to its contact C by controller 42 and the DC voltage of power source 26 is supplied through switch circuit 45 to tuner 25 as to operating voltage. At this time, flip-flop circuit 52 is reset by the output signal from key-board 41 and hence, switch circuits 54 and 55 are connected to contacts N. Accordingly, the television signal through cable 1 is fed to the tuner 25 through terminal 11, signal splitter 21 and switch circuit 55.

Further, the data for the frequency dividing ratio 1/n corresponding to channel A is read out from the ROM 43 by controller 42 and then set in counter 33. As a result, the tuning voltage corresponding to channel A is derived from filter 36 and then supplied to tuner 25. Accordingly, the additional free CATV broadcast for channel A is selected by tuner 25 and the corresponding video signal thereof can be derived from video detector 24.

When a pay-channel is received, a key 51 is pushed. The output signal therefrom is applied to controller 42 which the pay-channel and supplies a control signal to switch circuit 45. Thus, switch circuit 45 is connected to contact V thereof and hence the DC voltage of power source 26 is supplied to tuner 22 as the operating voltage.

The output signal from key 51 is also supplied to set flip-flop circuit 52 so that the Q-output thereof is applied to switch circuits 54 and 55 as control signals which change them to their contacts P. As a result, the television signal through cable 1 is supplied through terminal 11, signal splitter 21 and a splitting terminal 12 to descrambler 2 in which the television signal of the pay-channel is converted to a television signal of the standard system and corresponds to an unused channel of the conventional VHF channels such as channel 3. This converted television signal is supplied to tuner 22 through an input terminal 13 and switch circuit 55.

Further, a tuning voltage corresponding to the unused channel is generated in a tuning voltage source 53 for the pay-channel and then supplied through switch circuit 54 to tuner 22.

Accordingly, the television signal which is converted from a pay-channel to an unused channel such as channel 3 of the conventional VHF channels is received by tuner 22, then converted to a VIF signal and fed through VIF amplifier 23 to video detector 24. Thus, a video signal is supplied by video detector 24.

As set forth above, according to the embodiment of the present invention shown in FIG. 2, any of the broadcasts on conventional VHF channels, additional free CATV channels and a pay-channel can be switched by the operation of key-board 41 or key 51 associated only with television receiver 10. Accordingly a viewer does not have to discriminate whether the broadcast is on a conventional VHF channel, on an additional free CATV channel or on a pay-channel by use of descrambler 2, but the selection can be easily performed by only the channel selection associated with television receiver 10.

Further, if key 51 is included in a part of key-board 41 as a function key, the above described channel selection can be remotely controlled.

Figure 3:
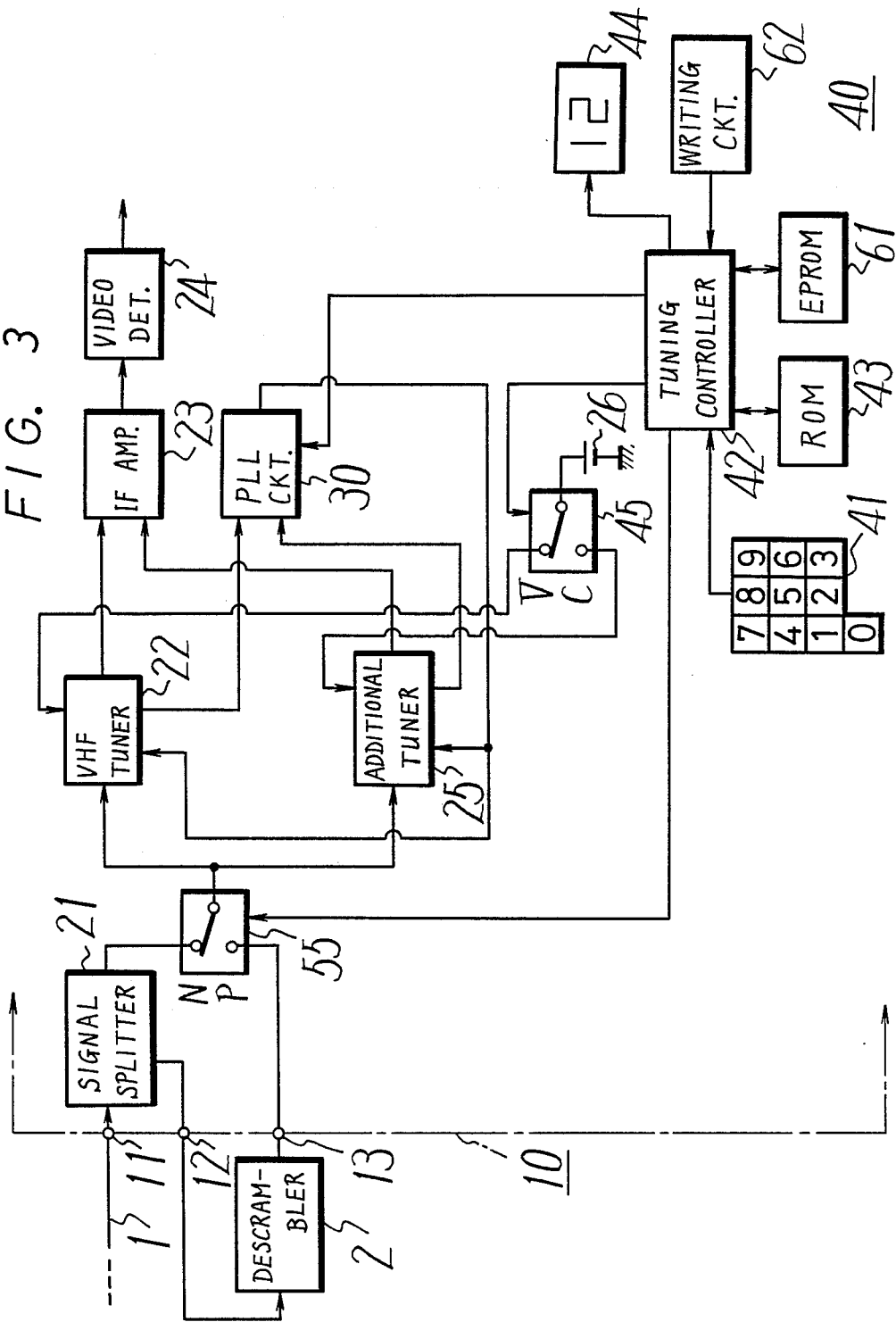

FIG. 3 shows an alternate embodiment of the invention in which an erasable programmable read-only-memory (EPROM) 61 is connected to tuning controller 42. Data indicating which one of the A to W channels in the additional free CATV channels is a pay-channel and data indicating that the pay-channel is converted to one unused channel in the conventional VHF channels are stored in EPROM 61. The writing of the data is carried out through a writing circuit 62 by the user or viewer.

In the embodiment of FIG. 3, switch circuit 55 is changed over by the output signal from controller 42 so that it is switched to one state upon receiving the conventional VHF channels and additional free CATV channels and to another state upon receiving a pay-channel. Accordingly, upon the reception of the conventional VHF channels or additional free CATV channels, it a desired channel is selected by key-board 41, switch circuit 55 is connected to its contact N and the operating voltage is selectively supplied from power source 26 to tuner 22 or 25. Accordingly, any of the conventional VHF channels and the additional free CATV channels which are selected by key-board 41 can be received.

If the channel selected, for example, channel B is a pay-channel, when "8" and "5" are inputted from key-board 41, channel 85 is identified as the pay-channel in controller 42 based upon the data from EPROM 61. Switch circuit 55 is then connected to its contact P and tuner 22 is set at an unused channel based upon the data from EPROM 61. Thus, the pay-channel is selected. In this case, the pay-channel can be selected only by operating key-board 41 similar to the selection of the other channels.

In each of the embodiments of FIGS. 2 and 3, there is only one pay-channel. A further embodiment of the invention shown in FIG. 4 accommodates a plurality of pay-channels which are received. In FIG. 4, switch circuits 56, 57 are changed over to be connected in ganged relation to switch circuits 54, 55 by controller 42 to one state upon receiving conventional VHF channels and additional free CATV channels and to another state upon receiving the pay-channels. A frequency converter 63 is provided to convert the VIF signal to a signal of the frequency corresponding to that of a known pay-channel. EPROM 61 contains data for each of the additional A to W channels, which indicate whether the channel is a pay-channel or not. Therefore, when the conventional VHF channels are received, the voltage of power source 26 is supplied through switch circuit 45 to tuner 22 and also the television signal through cable 1 is supplied to tuner 22 through terminal 11, signal splitter 21 and switch circuit 55. Further, tuning voltage from the PLL circuit 30 is applied through switch circuit 54 to tuner 22. Accordingly, the conventional VHF channel selected by key-board 41 is received.

Upon receiving the additional free CATV channels, the operating voltage is applied from power source 26 through switch circuit 45 to tuner 25 which is also supplied with the television signal from cable 1 through signal splitter 21. Thus, the additional free CATV channel selected by key-board 41 is received, converted to a VIF signal and then fed through switch circuit 57 to VIF amplifier 23. Accordingly, a desired additional free CATV channel selected by key-board 41 is received.

Further, when pay-channels are received, the numeral corresponding to a desired pay-channel is inputted by key-board 41. Then, this pay-channel is identified by controller 42 as a pay-channel based on the data from EPROM 61, and then switch circuits 54 to 57 are connected to their contacts P. At the same time, switch circuit 45 is connected to its contact C. Accordingly, the voltage of power source 26 is applied to tuner 25 through switch circuit 45 as the operating voltage and also to tuner 22 through switch circuit 56 as the operating voltage. Accordingly, both tuners 25 and 22 are made operative. The television signal through cable 1 is supplied through signal splitter 21 to tuner 25 to thereby convert the frequency of the television signal at the desired pay-channel to a VIF signal the (at this time, the descrambling operation has not yet been performed). This VIF signal from tuner 25 is fed to frequency converter 63 to be frequency converted to a predetermined input frequency of descrambler 2 and fed thereto.

At descrambler 2, the signal of the pay-channel is converted to a signal of the standard system and also to one unused channel of the conventional VHF channels such as channel 3, and then applied to another operative tuner 22 through terminal 13 and switch circuit 55. At this time, a predetermined tuning voltage for example corresponding to channel 3 is supplied from tuning voltage source 53 to tuner 22 through switch circuit 54. Accordingly, the signal from descrambler 2 is converted to the VIF signal at tuner 22 and then fed to VIF amplifier 23.

As described hereinbefore, according to the embodiment of FIG. 4, descrambler 2 which is designed to descramble a single pay-channel is used to receive several pay-channels so that the channel selection in descrambler 2 is unnecessary and hence the remote control operation can be achieved only on the side of television receiver 10.

FIG. 5 illustrates yet another embodiment of the invention which automatically determine whether or not a received additional free CATV channel is a pay-channel and, if the received channel is a pay-channel, a video signal to be reproduced is supplied through descrambler 2. In general, although the televisiion signal of the standard system is negatively AM-modulated by the carrier frequency signal and then derived, in the embodiment of FIG. 5, the scrambled television signal is positively AM-modulated by the carrier frequency signal and then derived.

The embodiment of FIG. 5 includes a video amplifier 71, a receiving tube 72 or cathode ray tube, a synchronous separator 73, a deflection circuit 74 and a deflection coil 75. The horizontal synchronizing pulse from synchronous separator 73 and the horizontal blanking pulse from deflection circuit 74 are both fed to a coincidence detecting circuit 81 which then produces a detected output of "1" when both pulses are not coincident and supplies the same to an RS flip-flop circuit 82 as the set pulse. Further, the output from key-board 41 is supplied to flip-flop circuit 82 as the reset input, and the Q-output from flip-flop circuit 82 is applied to the switch circuits 54 to 57 as the control signal.

A detecting circuit 83 receives the video signal from video detector 24 and detects whether a video signal is present. The detected output from video detector 83 which is supplied to detecting circuit 81 to stop the operation thereof when vacant channels are received.

With the embodiment shown in FIG. 5, when the channel number is inputted through key-board 41, flip-flop circuit 82 is reset, switch circuits 54 to 57 are each switched to contact N and the receiving mode of the inputted channel is selected. In this case, if the inputted or received channel is one of the conventional VHF channels or an additional free CATV channel, the horizontal synchronizing pulse is derived from synchronous separator circuit 73. Thus, the output signal from detecting circuit 81 is "0" and hence, flip-flop circuit 82 is not set. Therefore, the inputted channel is received unchanged.

However, when the receiving channel is switched to a pay-channel while switch circuits 54 to 57 are connected to contacts N, no horizontal synchronizing pulse is obtained from synchronous separator circuit 73 and the horizontal oscillating circuit in deflection circuit 74 oscillates freely. Therefore, the two inputs to detecting circuit 81 are not coincident and hence the output thereof is "1". Accordingly, flip-flop circuit 82 is set and switch circuits 54 to 57 are changed over to be connected to their contacts P. As a result, as explained in connection with FIG. 4, the television signal of the pay-channel is descrambled through tuner 25 and descrambler 2, the normal VIF signal through tuner 22 is supplied to VIF amplifier 23 and the normal video signal can be derived from video detector 24.

As in the above embodiments of the invention shown in FIGS. 2 to 5, descrambler 2 is shown schematically as a block. However, the construction of descrambler 2 is different depending upon the signal scrambling system employed in the pay-channel broadcasting. For example, when such a pay-channel broadcasting system is employed in which a standard television signal is obtained by negatively AM-modulating a carrier frequency signal with a video signal and a scrambled television signal is obtained by positively AM-modulating a carrier frequency signal with a video signal, descrambler 2 used in each of the embodiments shown in FIGS. 2 to 5 is schematically shown in FIG. 6. As shown in FIG. 6, descrambler 2 includes an input tuning or resonant circuit 201 resonant to a single pay-channel, an amplifier 202, a video detector 203 for detecting a positively AM-modulated video signal, a video amplifier 204 and an RF (radio frequency) modulator 205 for converting the detected video signal to an RF signal of a certain unused channel of the conventional VHF channels, such as channel 3.

In the present invention, it should be noted that according to the explanation in association with FIGS. 2 to 5, descrambler 2 as shown in FIG. 6 can be used for the case when a single pay-channel is received and the case when a plurality of pay-channels are received, so that the channel selection is unnecessary on the side of the descrambler.

Although specific embodiments of the present invention have been described in detail herein with reference to the accompanying drawings, it is to be understood that the invention is not limited to those precise embodiments, and that various changes and modifications may be effected therein by one skilled in the art without departing from the spirit and scope of the invention as defined in the appended claims.

We claim as our invention:

1. A television signal receiving system comprising:
    tuner means;
    channel selecting means connected to said tuner means and actuable for selecting a plurality of television channels;
    an input terminal for receiving television signals including standard television signals each transmitted through an allotted channel of said plurality of television channels which can be selected by actuation of said channel selecting means and a non-standard television signal transmitted through a television channel other than said plurality of television channels which can be selected;
    signal splitting means connected to said input terminal and having first and second output terminals;
    converting means connected to said first output terminal of said signal splitting means for converting said non-standard television signal to a converted standard television signal occupying a vacant one of said plurality of television channels which can be selected by actuation of said channel selecting means, said converting means having an output terminal;
    switch means for connecting one of said second output terminal of said signal splitting means and said output terminal of said converting means to said tuner means; and
    switch control means connected to said channel selecting means and said switch means for controlling said switch means upon actuation of said channel selecting means so that said switch means supplies one of said standard television signals and said converted standard television signal to said tuner means, and said channel selecting means is actuable to select any one of the received television signals for viewing.

2. The television signal receiving system of claim 1, and further comprising:
    electronic tuning means connected to said signal output put means;
    a channel selector;
    tuning control means connected between said channel selector and said electronic tuning means for supplying a selected tuning voltage to said electronic tuning means corresponding to a channel selected by said channel selector; and
    a video detector connected to said electronic tuning means for detecting a video signal to be reproduced on an image reproducing means.

3. The television signal receiving system of claim 2; wherein said channel selector includes a key for selecting said non-standard television signal, and said tuning control means includes a predetermined tuning voltage source and switching means responsive to said key for connecting said predetermined voltage source to said electronic tuning means for reproducing a video signal of said non-standard television signal.

4. The television signal receiving system of claim 3, wherein said tuning control means includes a read only memory for making correspondence between the selected channel of said standard television channels and the tuning voltage applied to said electronic tuning means and a programmable memory for making correspondence between said vacant channel and the tuning voltage applied to said electronic tuning means.

5. A television signal receiving system comprising:
    tuner means;
    channel selecting means;
    an input terminal for receiving television signals including a standard television signal occupying an allotted channel of a plurality of television channels and a non-standard television signal occupying a channel other than one of said plurality of television channels;
    signal splitting means connected to said input terminal and having first and second output terminals;
    converting means connected to said first output terminal of said signal splitting means for converting said non-standard television signal to said standard television signal occupying a vacant channel in said plurality of television channels which can be selected by said channel selecting means, said converting means having an output terminal;
    switch means for connecting one of said second output terminal of said signal splitting means and said output terminal of said converting means to said tuner means; and
    switch control means connected to said channel selecting means and said switch means for controlling said switch means upon actuation of said channel selecting means so that said switch means supplies one of said standard television signals and said converted standard television signal to said tuner means, and said channel selecting means is actuable to select any one of the received television signals for viewing.

6. A television signal receiving system comprising:
an input terminal for receiving television signals including standard television signals each transmitted through an allotted channel of a plurality of television channels and non-standard television signals each transmitted through an allotted channel other than one of said plurality of television channels;
first electronic tuning means connected to said input terminal for receiving said non-standard television signals and for frequency converting said non-standard television signals to obtain converted non-standard television signals of a predetermined fixed frequency range;
converting means connected to said first tuning means for re-converting said converted non-standard television signals to standard television signals occupying a predetermined vacant channel in said plurality of television channels;
second electronic tuning means connected to said converting means;
channel selecting means receiving said standard television signals occupying said allotted channels and said converted non-standard television signals occupying said vacant channel for selecting any one of the television signals for viewing;
tuning control means connected to said channel selecting means and to said first and second electronic tuning means for selectively applying tuning voltages to said first and second electronic tuning means corresponding to a channel appointed by said channel selecting means;
a video detector for deriving a video signal;
first switching means controlled by said tuning control means for operatively coupling one of said first and second electronic tuning means selectively between said input terminal and said video detector when said standard television signals are selected by said channel selecting means; and
second switching means controlled by said tuning control means for coupling said first electronic tuning means, said converting means and said second electronic tuning means in series between said input terminal and said video detector when said non-standard television signals are selected by said channel selecting means.

7. A television signal receiving system comprising:
channel selecting means;
an input terminal for receiving television signals including first standard television signals each transmitted through an allotted channel of a first set of television channels which can be selected by actuation of said channel selecting means, second standard television signals each transmitted through an allotted channel of a second set of television channels which can be selected by actuation of said channel selecting means and a scrambled television signal transmitted through an allotted channel of said second set of television channels which can be selected by actuation of said channel selecting means;
signal splitting means connected to said input terminal and having first and second output terminals;
a descrambler connected to said first output terminal of said signal splitting means for converting said scrambled television signal to said standard television signal occupying a vacant channel in said first set of television channels, said descrambler having an output terminal;
a first tuner connected to said input terminal and said descrambler for selectively tuning said first standard television signals each occupying said allotted channel of said first set of television channels and said converted standard television signal occupying said vacant channel in said first set of television channels from said descrambler;
a second tuner connected to said input terminal for selectively tuning said second standard television signals each occupying said allotted channel of said second set of television channels;
switching means for connecting one of said second output terminal of said signal splitting means and said output terminal of said descrambler to said first and second tuners;
switch control means connected to said first and second tuners and said channel selecting means for controlling said switching means upon actuation of said channel selecting means so that said switching means supplies one of said first and second standard television signals and said converted standard television signal to said first and second tuners so that said channel selecting means is actuable to select any one of said received television signal for viewing; and
a video detector connected to said first and second tuners.

8. A television signal receiving system comprising:
channel selecting means;
an input terminal for receiving television signals including first standard television signals each transmitted through an allotted channel of a first set of television channels which can be selected by actuation of said channel selecting means, second standard television signals each transmitted through an allotted channel of a second set of television channels which can be selected by actuation of said channel selecting means, and a plurality of scrambled television signals each transmitted through an allotted channel of said second set of television channels which can be selected by actuation of said channel selecting means;
signal splitting means connected to said input terminal and having first and second output terminals;
a first tuner connected to said channel selecting means for selectively tuning said second standard television signals each occupying said allotted channel of said second set of television channels and said scrambled television signals each occupying said allotted channel of said second set of television channels;
a descrambler connected to said first tuner for converting output signals obtained from said first tuner corresponding to said scrambled television signals to standard television signals occupying a vacant channel in said first set of television channels, said descrambler having an output terminal;
a second tuner connected to, said channel selecting means, and said descrambler for selectively tuning said first standard television signals each occupying said allotted channel of said first set of television channels and said converted standard television signals occupying said vacant channel;
switch means for connecting one of said second output terminal of said signal splitting means and said output terminal of said descrambler to said first and second tuners;

switch control means connected to said first and second tuners and said channel selecting means for controlling said switching means upon actuation of said channel selecting means so that said switching means supplies one of said first standard television signals and said converted standard television signals to said first and second tuners so that said channel selecting means is actuable to select any one of said received television signals for viewing; and a video detector connected to said first and second tuners.

9. A television receiver for receiving standard television channel signals each transmitted through an allotted channel of a plurality of television channels and at least one non-standard television channel signal transmitted through an allotted channel other than one of said plurality of television channels, comprising:

channel selector meand for selecting one of said television channel signals;

tuner means for tuning said one of said television channel signals selected by said channel selector means;

signal splitting means receiving said television channel signals and for supplying at least two identical television channel signals therefrom;

converting means for converting said at least one non-standard television channel signal to a vacant standard television channel signal in said plurality of television channels for tuning by said tuner means;

switch means for supplying one of said standard television channel signals and said converted non-standard television channel signal to said tuner means; and switch control means for controlling said switch means in response to actuation of said channel selector means to select any one of said television channel signals for viewing.

10. The television receiver of claim 9; wherein said channel selector means includes:

keyboard means for generating output signals in response to a selected television channel signal; and tuning controller means for receiving said output signals from said keyboard means and actuating said tuner means to tune said selected television channel signal.

11. The television receiver of claim 10; and further comprising phase locked loop means for supplying a tuning voltage to said tuner means corresponding to said selected television channel signal.

12. The television receiver of claim 11, in which said tuning voltage from said phase locked loop means corresponds to a standard television channel signal; and further comprising tuning voltage source means for supplying a tuning voltage to said tuner means when said non-standard television channel signal is selected.

13. The television receiver of claim 12; and further comprising:

tuning voltage switch means for alternately supplying said tuning voltages from said phase locked loop means and said tuning voltage source means to said tuner means; and actuating means coupled to said tuning controller means for actuating said tuning voltage switch means in response to said selected television channel signal.

14. The television receiver of claim 13; and further comprising key means connected to said tuning controller means and said actuating means for selecting said non-standard television channel signal.

15. The television of claim 11; and further comprising programmable memory means connected to said tuning controller means for storing data indicating which of said television channel signals is a non-standard television channel signal and data indicating which of said standard television channels are vacant.

16. The television receiver of claim 15; and further comprising programming means for storing said data in said programmable memory means.

17. The television receiver of claim 10, in which said non-standard television channel signal is a scrambled standard television signal with a frequency different than that of said standard television channel signals; and wherein said converting means comprises:

frequency converting means for generating scrambled frequency converted channel signals from said non-standard television channel signal having a frequency corresponding to one of said standard television channel signals; and means for descrambling said scrambled frequency converted channel signals from said frequency converting means to said vacant standard television channel signals.

18. The television receiver of claim 17; and further comprising programmable memory means connected to said tuning controller means for storing data indicating which of said selected television channel signals are non-standard television channel signals.

19. The television receiver of claim 18; and further comprising means for programming said data into said programmable memory means.

20. The television receiver of claim 12; wherein the video signals included in said television channel signals have horizontal sync signals and horizontal blanking signals and further comprising:

video signal processing means;

horizontal sync signal separating means connected to said video signal processing means for separating said horizontal sync signals included in said video signals; and wherein said switch control means comprises:

coincidence detecting means connected to said horizontal sync signal separating means and said video signal detecting means for generating output signals in response to comparisons between said horizontal sync signals and said horizontal blanking signals; and switch signal generating means for generating switch signal to actuate said switch means in response to said output signals from said coincidence detecting means.

* * * * *